(12) United States Patent
Zhang et al.

(10) Patent No.: US 12,401,737 B2
(45) Date of Patent: Aug. 26, 2025

(54) LAMINATED DISPLAY MODULE AND ELECTRONIC DEVICE

(71) Applicant: HONOR DEVICE CO., LTD., Shenzhen (CN)

(72) Inventors: Yujun Zhang, Shenzhen (CN); Ning Guo, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/004,143

(22) PCT Filed: May 12, 2022

(86) PCT No.: PCT/CN2022/092365
§ 371 (c)(1),
(2) Date: Jan. 3, 2023

(87) PCT Pub. No.: WO2022/257694
PCT Pub. Date: Dec. 15, 2022

(65) Prior Publication Data
US 2024/0106926 A1    Mar. 28, 2024

(30) Foreign Application Priority Data
Jun. 9, 2021    (CN) .......................... 202110642361.6

(51) Int. Cl.
*H04M 1/18*     (2006.01)
*B32B 3/02*     (2006.01)
(Continued)

(52) U.S. Cl.
CPC ............. *H04M 1/185* (2013.01); *B32B 3/02* (2013.01); *B32B 3/14* (2013.01); *B32B 3/266* (2013.01);
(Continued)

(58) Field of Classification Search
CPC .. B32B 3/02; B32B 3/14; B32B 3/266; B32B 2457/20; H04M 1/0269; H04M 1/185
See application file for complete search history.

(56) References Cited

U.S. PATENT DOCUMENTS 10,856,420 B2   12/2020   Kim et al.
11,380,859 B2   7/2022    Teng et al.
(Continued)

FOREIGN PATENT DOCUMENTS

CN    108831303 A    11/2018
CN    108878479 A    11/2018
(Continued)

OTHER PUBLICATIONS

Zhang, Yunti, "CN112786621A—English Translation", 2021, SIPO, pp. 1-23 (Year: 2021).*

*Primary Examiner* — Maria V Ewald
*Assistant Examiner* — Ethan Weydemeyer
(74) *Attorney, Agent, or Firm* — Fish & Richardson P.C.

(57) ABSTRACT

This application provides a laminated display module and an electronic device, including a cover layer, a thin film packaging layer, a display layer, and a support membrane layer that are sequentially covered through lamination from top to bottom. The cover layer includes a smooth region and two curved surface regions along a longitudinal direction. The two curved surface regions are respectively located on two sides of the smooth region, where each curved surface region includes one bending region, and each bending region is projected onto the support membrane layer to form a projection region. The support membrane layer includes a main support region and two side support regions along a longitudinal direction, and a gap is provided between either of the side support regions and the main support region.

17 Claims, 13 Drawing Sheets

(51) Int. Cl.
*B32B 3/14* (2006.01)
*B32B 3/26* (2006.01)
*H04M 1/02* (2006.01)

(52) U.S. Cl.
CPC ....... *H04M 1/0269* (2022.02); *B32B 2457/20* (2013.01)

(56) References Cited

U.S. PATENT DOCUMENTS

| | | |
|---|---|---|
| 11,513,560 B2 | 11/2022 | Dong et al. |
| 2019/0250665 A1 | 8/2019 | Kim |
| 2020/0296843 A1 | 9/2020 | Gao et al. |
| 2021/0153363 A1 | 5/2021 | Cao et al. |
| 2022/0050321 A1 | 2/2022 | Park et al. |
| 2022/0396050 A1 | 12/2022 | Zhu |

FOREIGN PATENT DOCUMENTS

| | | |
|---|---|---|
| CN | 110148620 A | 8/2019 |
| CN | 110648593 A | 1/2020 |
| CN | 110767096 A | 2/2020 |
| CN | 110992828 A | 4/2020 |
| CN | 111261642 A | 6/2020 |
| CN | 111785738 A | 10/2020 |
| CN | 112086570 A | 12/2020 |
| CN | 112150929 A | 12/2020 |
| CN | 112436039 A | 3/2021 |
| CN | 112563431 A | 3/2021 |
| CN | 112599018 A | 4/2021 |
| CN | 112735279 A | 4/2021 |
| CN | 112786621 A | 5/2021 |
| CN | 112863349 A | 5/2021 |
| CN | 113516918 A | 10/2021 |
| KR | 20170077927 A | 7/2017 |
| KR | 20200034333 A | 3/2020 |
| WO | 2018121322 A1 | 7/2018 |

\* cited by examiner

LAMINATED DISPLAY MODULE AND ELECTRONIC DEVICE

CROSS-REFERENCE TO RELATED APPLICATIONS

This application is a national stage of International Application No. PCT/CN2022/092365, filed on May 12, 2022, which claims priority to Chinese Patent Application No. 202110642361.6, filed on Jun. 9, 2021. The disclosures of both of the aforementioned application are hereby incorporated by reference in their entireties.

TECHNICAL FIELD

This application relates to the display field, and in particular, to a laminated display module and an electronic device.

BACKGROUND

As a display technology in a display module develops, a proportion of a screen on a human-computer interaction interface is increasing, and a product with a dual-curved screen has become a mainstream. A curved screen means that the screen is no longer a flat glass cover, and a part of the screen on the left and right sides of the screen is a downwardly curved surface. A dual-curved screen means that the front of the screen is a curved screen, and a back cover at the back of the screen has a specific curvature.

Using a carrier mobile phone in the display module as an example, FIG. 1a is a schematic diagram of a front shape of a mobile phone with a dual-curved screen according to this application, and FIG. 1b is a schematic diagram of a back shape of a mobile phone with a dual-curved screen according to this application. In FIG. 1a, a region A1 and a region B1 are curved surface positions on the front of the mobile phone with a dual-curved screen; and in FIG. 1b, a region C1 and a region D1 are curved surface positions on the back of the mobile phone with a dual-curved screen. Interface display of the mobile phone with a dual-curved screen is mainly related to a front shape structure of the mobile phone. FIG. 2 is a schematic diagram of a cross-section structure of a dual-curved screen display module. As shown in FIG. 2, a display module in curved surface positions can be structurally divided into a cover layer 100, a thin film packaging layer 200, a display layer 300, and a support membrane layer 400 from top to bottom. During lamination of the display module, local curved surface positions may be subjected to relatively high stress due to a difference in a module process. Once a stress value exceeds a stress threshold that the display layer 300 can withstand, a crack may occur in the thin film packaging layer 200 in the curved surface positions due to a material property. Vapor may pass through the crack to enter a light emitting layer in the display layer 300, then a material of the light emitting layer soon fails under action of the vapor, and a shading may be formed near the crack, which affects a display effect of the display layer 300 in the display module. Therefore, the display effect of the display 300 in the display module can be ensured by avoiding the crack occurrence in the thin film packaging layer 200.

SUMMARY

This application provides a laminated display module, to reduce stress sensed by a display layer in curved surface positions during lamination, so as to avoid a crack occurrence in a thin film packaging layer.

According to a first aspect, this application provides a laminated display module, including a cover layer, a thin film packaging layer, a display layer, and a support membrane layer that are sequentially covered through lamination from top to bottom. The cover layer includes a smooth region and two curved surface regions along a longitudinal direction. The two curved surface regions are respectively located on two sides of the smooth region, each curved surface region includes one bending region, and each bending region is projected onto the support membrane layer to form a projection region. The support membrane layer includes a main support region and two side support regions along a longitudinal direction, and a gap is provided between either of the side support regions and the main support region.

The gap may be a crack that completely separates two parts, or may be one or more geometric shapes that are excavated on a projection region.

In this aspect, the projection regions in the support membrane layer are completely excavated or partially excavated, so that the support membrane layer in the curved surface positions on two sides becomes relatively soft, and the support membrane layer supports the display layer. After the support membrane layer becomes soft in an excavation manner, stress sensed by the entire display layer in the curved surface positions becomes low, thereby avoiding a problem of a crack occurrence in the thin film packaging layer in the curved surface positions.

With reference to the first aspect, in a possible implementation, a width of any gap is equal to a width of a projection region on a same side. Therefore, complete excavation of the projection region is implemented, so that the entire support membrane layer becomes soft, and stress sensed by the entire display layer becomes low.

With reference to the first aspect, in a possible implementation, the gap includes M excavation regions, where M is a positive integer and M≥1, and therefore partial excavation of the projection region is implemented.

With reference to the first aspect, in a possible implementation, the M excavation regions are evenly distributed in two projection regions, M is an even number, and each projection region includes M/2 excavation regions, thereby avoiding a phenomenon that the display layer senses different stress due to different excavation areas of the projection regions on two sides. When stress sensed by the display layer on two sides of a same subregion is different, there may be a case in which a crack occurs on one side and no crack occurs on the other side.

With reference to the first aspect, in a possible implementation, shapes of the excavation regions include at least one of a circular shape, a square shape, a rhombic shape, an oval shape, a triangular shape, a star shape, and an irregular shape, so that a plurality of excavation manners may be selected without being limited to several limited excavation solutions during excavation.

With reference to the first aspect, in a possible implementation, areas of the M excavation regions are equal, and therefore even excavation of the projection region is implemented. The projection region is evenly excavated, so that the curved surface positions of the entire support membrane layer become relatively soft, and stress sensed by the entire display layer in the curved surface positions becomes low, thereby avoiding a crack occurrence in the thin film packaging layer in the curved surface positions.

With reference to the first aspect, in a possible implementation, the M excavation regions include a first group and a second group, and an area of the first group is greater than an area of the second group, and therefore uneven excavation of the projection region is implemented. Crack occurrence probability is generally classified, for example, classified into a relatively high crack probability region and a relatively low crack probability region. In the relatively high crack occurrence probability region, an excavation range of the projection region is relatively large; and conversely, in the relatively low crack occurrence probability region, an excavation range of the projection region is relatively small, so that the entire support membrane layer after excavation is adapted to stress distribution, and it is easily to implement in a process.

With reference to the first aspect, in a possible implementation, the M excavation regions include at least two second groups. The first group is disposed between the at least two second groups, and in this case, crack probability distribution can be intuitively reflected based on an area difference.

With reference to the first aspect, in a possible implementation, in the projection region on any side, areas of the M/2 excavation regions are partially equal or all unequal. Each excavation region corresponds to one crack probability value, and an area of the excavation region with a large crack probability value is greater than an area of the excavation region with a small crack probability value, and therefore another uneven excavation of the projection region is implemented. Targeted classification is performed based on crack occurrence probability, for example, excavation regions are arranged in descending order of crack occurrence probability. Higher crack occurrence probability indicates a larger excavation range, and conversely, lower crack occurrence probability indicates a smaller excavation range. In other words, an excavation area of the projection region is positively correlated with crack occurrence probability of subregions in the thin film packaging layer, so that the excavation regions of the projection regions on the two sides completely correspond to crack probability distribution, thereby avoiding a crack occurrence to a maximum extent.

With reference to the first aspect, in a possible implementation, in the projection region on any side, areas of one or two excavation regions in the center are greater than areas of the excavation regions on the two sides, and the areas of the excavation regions on the two sides show a gradient descent from the center to the two sides, so that still another uneven excavation of the projection region is implemented. That is, one or two regions in the center are used as reference subregions, and excavation ranges of the regions in the center are the largest, excavation ranges of remaining regions are centered on the reference subregions, and sequentially show a gradient descent to the two sides, so that subregions 1-17 in the projection region of the support membrane layer generally correspond to stress distribution, and it is easy to implement in a process.

According to a second aspect, this application further provides an electronic device, including a housing and a laminated display module, and the laminated display module is buckled in the housing. A crack occurrence in a thin film packaging layer in curved surface positions can be avoided based on a structural design of the laminated display module, thereby achieving a better display effect.

DESCRIPTION OF EMBODIMENTS

Technical solutions in embodiments of this application will be clearly described with reference to accompanying drawings in embodiments of this application. Apparently, the described embodiments are merely some rather than all of the embodiments of this application. All other embodiments obtained by a person of ordinary skill in the art based on embodiments of this application without creative efforts shall fall within the protection scope of this application.

Figure 1A:
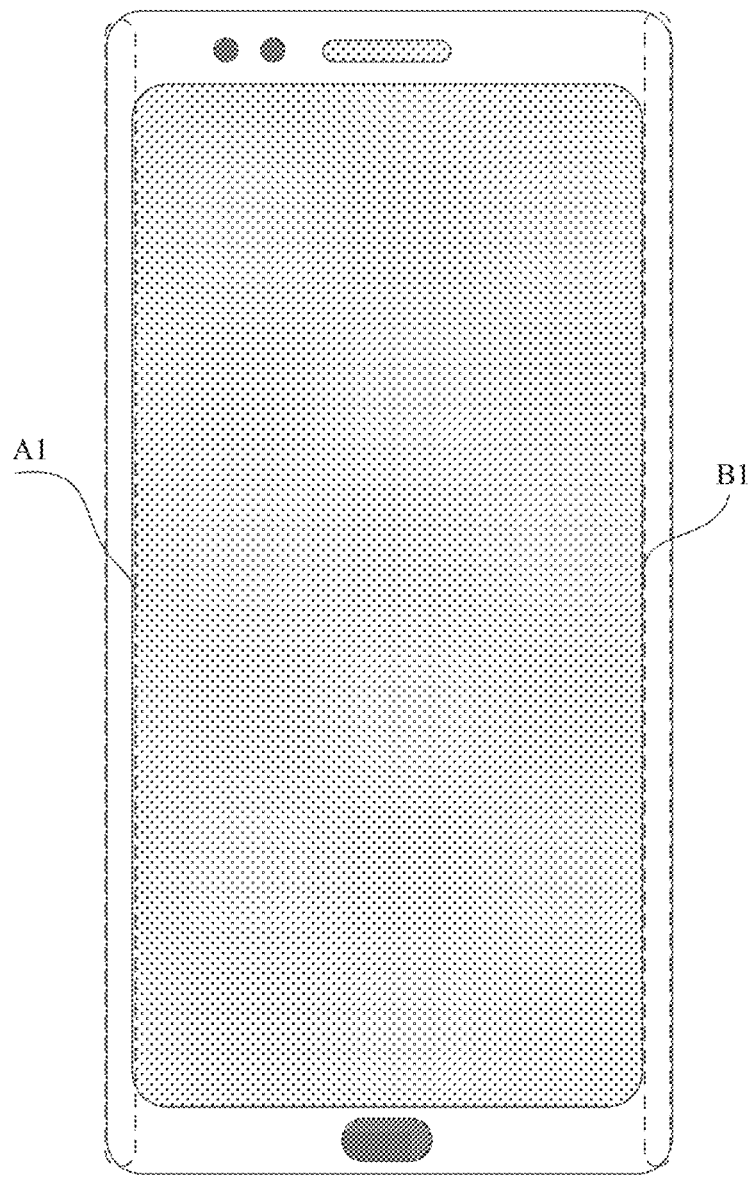
FIG. 1a is a schematic diagram of a front shape of a mobile phone with a dual-curved screen according to this application.
Figure 1B:
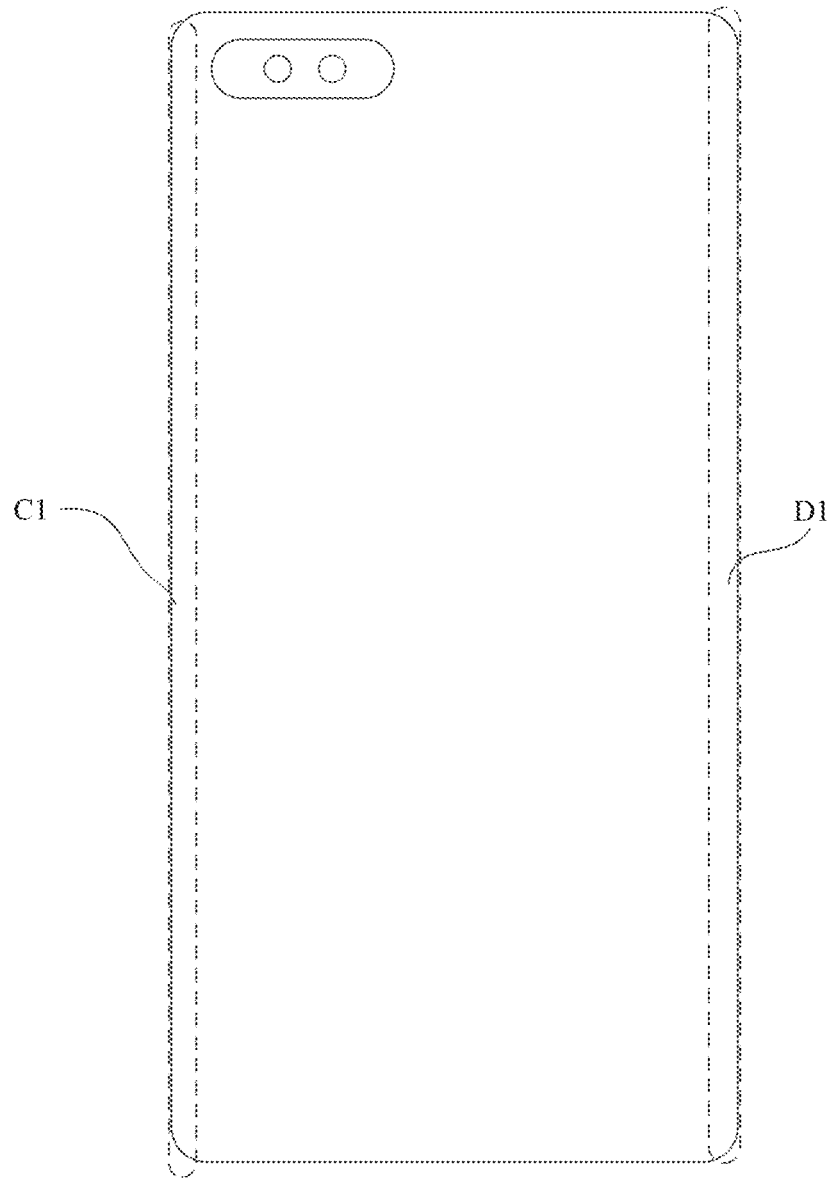
FIG. 1b is a schematic diagram of a back shape of a mobile phone with a dual-curved screen according to this application.
Figure 2:
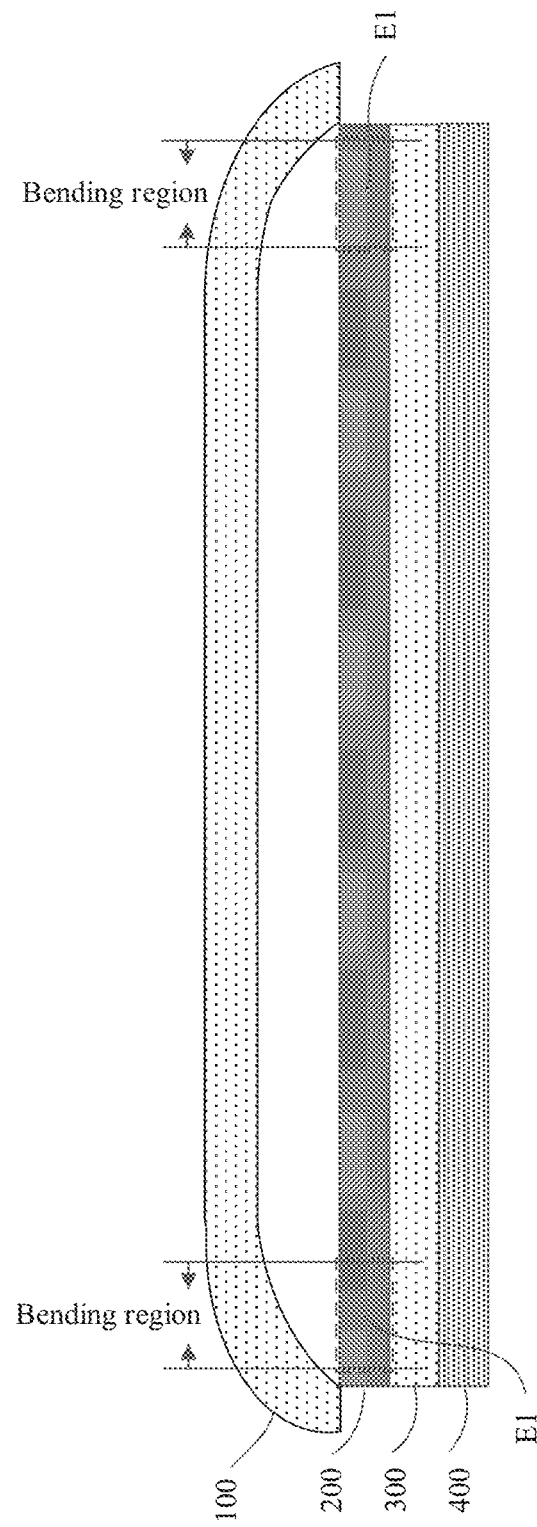
FIG. 2 is a schematic diagram of a cross-section structure of a dual-curved screen display module.

An application scenario of this application is that a dual-curved screen display module has been widely used, for example, a most representative mobile phone with a dual-curved screen is highly popular because of a beautiful appearance and full screen display. However, the mobile phone with a dual-curved screen has some defects, for example, the mobile phone with a dual-curved screen may have a more complex process than a common flat-screen mobile phone. A most common case is that a crack and a shading sometimes may occur in curved surface positions on two sides of a dual-curved screen. FIG. 2 is a schematic diagram of a cross-section structure of a dual-curved screen display module.

As shown in FIG. 2, the dual-curved screen display module includes a cover layer 100, a thin film packaging layer 200, a display layer 300, and a support membrane layer 400. A region to which two arrows point is a bending region of the cover layer 100, and the bending region is a bent region where the cover layer 100 is actually curved with a specific radian change during lamination. In a manner, the support membrane layer 400 covers the entire bending region. A crack occurring in the thin film packaging layer 200 are located in curved surface positions on two sides, and are mainly located in a position where the bending region of the cover layer 100 is projected onto a plane. As shown in FIG. 2, a region E1 in a dashed frame of the thin film packaging layer 200 is a range of the cover layer 100 projected onto the plane, that is, the region E1 is usually a concentrated region where cracks occur in the thin film packaging layer 200.

In a manner, an attempt to resolve a problem of a crack occurrence in the thin film packaging layer 200 is made by using a lamination process, and usually a laminated coverage forming test design and a lamination pressure parameter test design may be first performed. During lamination, the thin film packaging layer 200, the display layer 300, and the support membrane layer 400 are first attached to one layer of a carrier film, and then the carrier film and the three layers are all placed in a lamination coverage forming. Under a pressure of forming coverage, the cover layer 100 is laminated with the three layers by using an optical clear adhesive. However, during configuration of the lamination process, before lamination, layers are flat, a sudden change occurs at the bending region, and high stress will be generated locally during the sudden change. A material property of the thin film packaging layer 200 may result in the crack occurrence in the thin film packaging layer 200. Therefore, the problem of a crack occurrence in the thin film packaging layer 200 in the curved surface positions cannot be resolved through the lamination process.

To resolve the foregoing problem, this application provides a laminated display module, to reduce stress sensed by the display layer in the curved surface positions during lamination, so as to avoid the crack occurrence in a thin film packaging layer.

Figure 3:
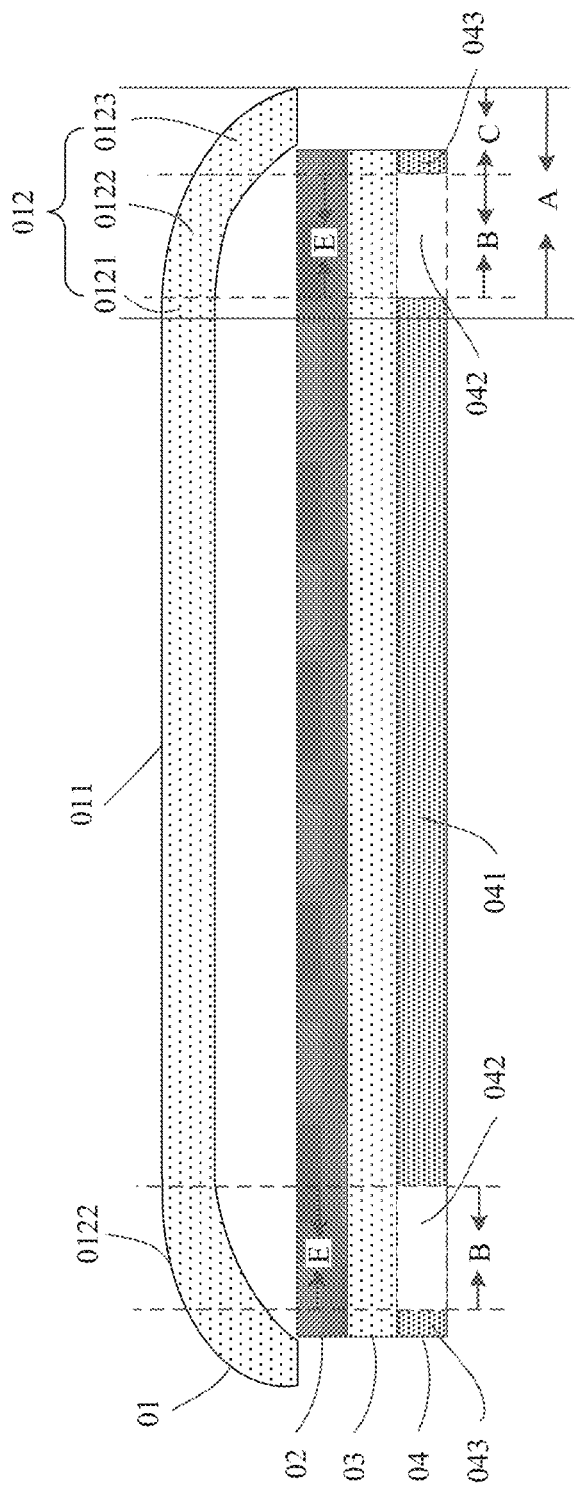
FIG. 3 is a schematic diagram of a cross-section structure of a laminated display module according to an embodiment of this application.

FIG. 3 is a schematic diagram of a cross-section structure of a laminated display module according to an embodiment of this application. The laminated display module includes a cover layer 01, a thin film packaging layer 02, a display layer 03, and a support membrane layer 04 that are sequentially covered through lamination from top to bottom. The cover layer 01 includes one smooth region 011 and two curved surface regions 012 along a longitudinal direction. The smooth region 011 is a region presenting a planar effect, and the curved surface regions 012 are regions presenting a curved surface effect. The two curved surface regions 012 are respectively located on two sides of the smooth region 011, and the two curved surface regions 012 have a same structure.

A structure of one curved surface region 012 is used as an example for description. The curved surface region 012 includes a transition region 0121, a bending region 0122, and an extension region 0123. The transition region 0121 is a region range where the smooth region 011 transitions to the curved surface region 012, and usually a bending radian is relatively small. The bending region 0122 is a region with a relatively large actual bending range during lamination, the extension region 0123 is usually a lamination junction, and a bending radian is also relatively small. Ranges of the transition region 0121, the bending region 0122, and the extension region 0123 may be determined by following a specific rule. For example, the ranges may be determined based on a value of an actual bending curvature range. Bending curvatures of both the transition region 0121 and the extension region 0123 are usually less than a bending curvature of the bending region 0122.

The display layer 03 is usually a flexible display made of a soft material. A light-emitting material is included inside the display layer 03, for example, an organic light-emitting diode (organic light-emitting diode, OLED), also referred to as an organic electroluminescence display. The flexible display layer 03 is a deformable and bendable display apparatus. The thin film packaging layer 02 is configured to protect the light-emitting material inside the flexible display layer 03, so as to prevent the light-emitting material from being corroded by water and oxygen. The cover layer 01 is usually a glass cover, and is configured to present a display effect of the flexible display layer 03 while protecting the flexible display layer 03. The support membrane layer 04 is configured to support the flexible display layer 03.

The thin film packaging layer 02 usually uses a technique, such as atomic layer deposition or ink jet printing. For example, the thin film packaging layer 02 may include organic layer deposition and inorganic layer deposition. A crack is more likely to occur in the thin film packaging layer 02 due to a material property of the thin film packaging layer 02. Once the crack occurs, water and oxygen may penetrate into the light-emitting material inside the display layer 03 through the crack, which results in failure of the light-emitting material.

When a module factory produces batches of the dual-curved screen display modules, there may be a specific number of failed products. For example, as shown in FIG. 3, for some mobile phone with a dual-curved screens, cracks may occur in regions E in the thin film packaging layer 02, and the regions E are projection regions of the bending regions 0122 that are located on two sides of the mobile phone with a dual-curved screens and that correspond to the thin film packaging layer 02. When the cracks occur in the regions E in the thin film packaging layer 02, the display 03 in the display module cannot normally display a complete effect. To find a specific position of a crack occurrence in the failed product, an implementation may be that when the module factory performs statistical analysis on the failed products, regions E in which a crack easily occur are divided based on different levels, to determine probability distribution of crack occurrences in different positions.

Figure 4:
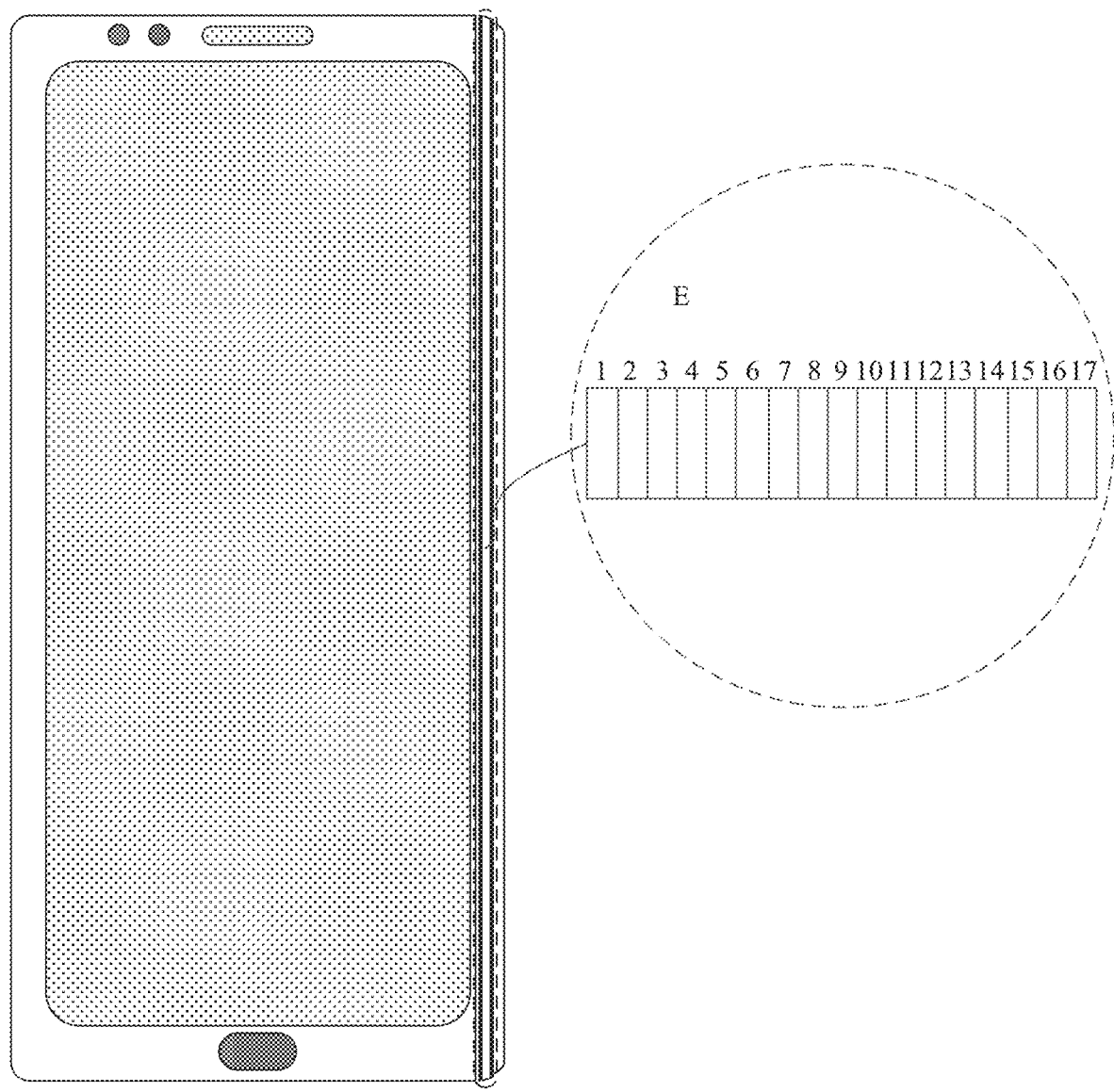
FIG. 4 is a schematic diagram of dividing a region E in a curved surface position into 17 equal parts in a display module.

In an example, a region E is divided into 17 equal parts. FIG. 4 is a schematic diagram of dividing a region E in a curved surface position into 17 equal parts in a display module. The regions E on two sides of the mobile phone have a same division manner and a division range. In FIG. 4, one side is used as an example for description, and a schematic diagram of an enlarged part of an intercepted region E is shown in a dotted circle in the figure. In this embodiment of this application, because the cover layer 01, the thin film packaging layer 02, the display layer 03, and the support membrane layer 04 are covered through lamination, dividing the region E in the thin film packaging layer 02 into 17 equal parts means that the four layers are divided into 17 equal parts, in other words, each layer corresponds to 17 equal subregions. A purpose of dividing an equal subregion is to determine probability distribution of crack defects occurring in the subregions. In FIG. 4, 1-17 represent different equal subregions, and subregions 1-17 are respectively the first subregion, the second subregion, . . . , and the seventeenth subregion.

Specifically, during calculation of crack occurrence probability in the subregions, a possible implementation may be that when the failed products are analyzed, there are a total of 1000 mobile phones with cracks, and the display layer 03 is divided into 17 subregions. Because a bending curvature of each subregion is different, stress sensed by the display layer 03 in each subregion is also different. Correspondingly, in the 17 subregions in the thin film packaging layer 02, crack occurrence probability of each subregion is also different. Crack distribution of the 17 subregions in thin film packaging layer 02 on two sides of each mobile phone is separately compared, and a result obtained by analyzing failed products is described below. Table 1 is a statistical table of crack occurrence frequency of the 17 subregions in the thin film packaging layer. Columns 1-17 represent the divided 17 subregions in the thin film packaging layer 02, and distribution frequency represents probability distribution of crack occurrence in the subregions in the thin film packaging layer 02.

TABLE 1

A statistical table of crack occurrence frequency of the 17 subregions in the thin film packaging layer

| Number of columns | Distribution frequency |
| --- | --- |
| 1 | 1% |
| 2 | 1% |
| 3 | 2% |
| 4 | 1% |
| 5 | 4% |
| 6 | 4% |
| 7 | 5% |
| 8 | 8% |
| 9 | 11% |
| 10 | 9% |
| 11 | 11% |
| 12 | 13% |
| 13 | 12% |
| 14 | 7% |
| 15 | 5% |
| 16 | 5% |
| 17 | 1% |

Figure 5:
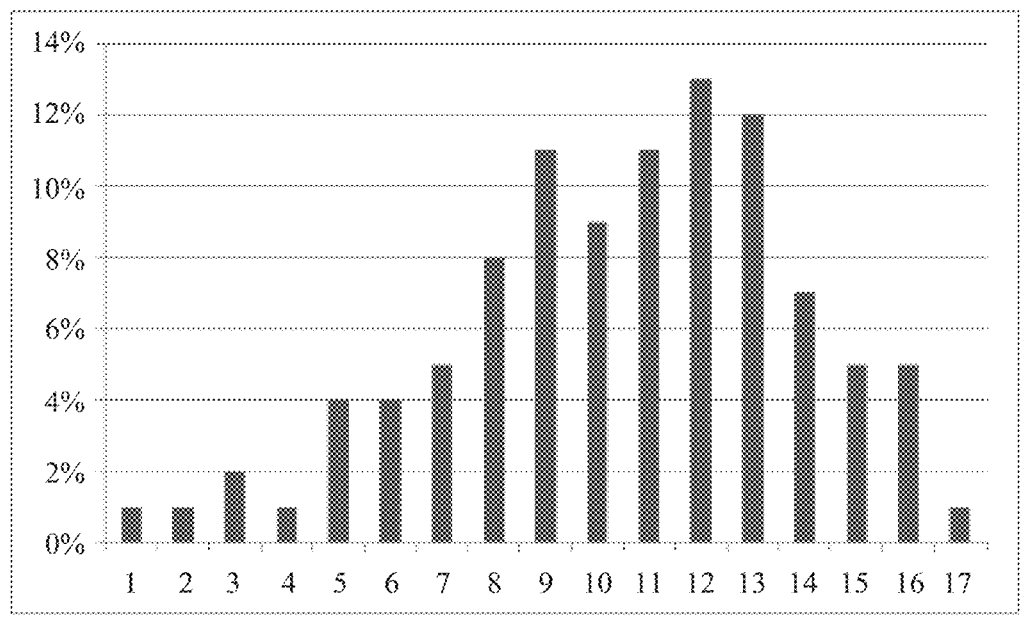
FIG. 5 is a diagram of statistical distribution of crack occurrence frequency of a thin film packaging layer 02 in a curved surface position.

It can be seen from the statistical analysis result in Table 1 that in the thin film packaging layer 02, which subregions have relatively high crack occurrence probability. FIG. 5 is a diagram of statistical distribution of crack occurrence frequency of a thin film packaging layer 02 in a curved surface position. In FIG. 5, rows 1-17 represent the 17 subregions in the thin film packaging layer 02, and column from 0% to 14% represent probability distribution statistics of crack occurrences in the subregions. It can be intuitively seen from the diagram of statistical distribution in FIG. 5 that in the thin film packaging layer 02, crack occurrence probability of the subregions 8-14 is relatively high, and therefore, in the display layer 03, stress sensed by subregions 8-14 is relatively high. Crack occurrence probability of both subregions 1-7 and subregions 15-17 is relatively low, and therefore, in the display layer 03, stress sensed by subregions 1-7 and subregions 15-17 is relatively small. It can be learned that crack occurrence in the thin film packaging layer 02 has a specific regional feature.

Among the four layers of the cover layer 01, the thin film packaging layer 02, the display layer 03, and the support membrane layer (A, the cover layer 01, the thin film packaging layer 02, and the display layer 03 are directly related to a visual presentation effect. If the cover layer 01, the thin film packaging layer 02, and the display layer 03 are excavated, the visual presentation effect is directly affected. For the regional feature of cracks in the thin film packaging layer 02, in this application, a projection position that is located in the support membrane layer 04 and that corresponds to the bending region 0122 is completely excavated, and is partially excavated based on the distribution features of crack probability, to resolve the problem of a crack occurrence in the thin film packaging layer 02 in the curved surface positions.

Either of the curved surface region 012 includes one bending region 0122, and each bending region 0122 is projected onto the support membrane layer 04 to form a projection region 042. In this embodiment of this application, the projection position that is located in the support membrane layer 04 and that corresponds to the bending regions 0122 is excavated, in other words, the projection region 042 is excavated.

When the projection region 042 is excavated, an excavation range needs to meet a specific correspondence. Specifically, a distance projected by the curved surface region 012 onto a plane is denoted as A; a distance projected by the bending region 0122 onto the plane is denoted as B, in other words, an overall width of the projection regions 042 is denoted as B; a distance projected by an extension region 0123 onto the plane is denoted as C; and A. B, and C should meet B≥41% A, and C≤41% A. On a basis of a plurality of times of simulation, if the correspondence is followed, it can be ensured that after the projection region 042 is excavated, a support effect of the support membrane layer 04 is the same as a support effect of the support membrane layer 04 before the projection region 042 is excavated. In addition, after excavation, the entire support membrane layer 04 becomes relatively soft, so that stress sensed by the display layer 03 in the curved surface positions becomes low during lamination, thereby avoiding the problem of a crack occurrence in the thin film packaging layer 02.

The support membrane layer 04 includes a main support region 041, two projection regions 042, and two side support regions 043 along a longitudinal direction. A gap is provided between either of the side support regions 043 and the main support region 041. In this embodiment of this application, the gap may be a crack that completely separates two parts, or may be one or more geometric shapes that are excavated on a projection region. When the projection regions 042 are excavated, there are two types of excavation manners: complete excavation and partial excavation, and the following separately describes two manners.

A complete excavation manner means that the projection regions 042 are completely excavated regardless of crack occurrence frequency in the thin film packaging layer 02 in the curved surface positions. In this case, the gap is the crack that completely separates the main support region 041 from the side support region 043, and a width of the crack is a width of a projection region 042 on a same side. The complete excavation manner does not consider that in the thin film packaging layer 02, which subregions have high crack occurrence probability and which subregions have low crack occurrence probability. Provided that the regions are the projection regions 042 corresponding to projection of the bending regions 0122, the projection regions 042 in the support membrane layer 04 are completely excavated.

Figure 6:
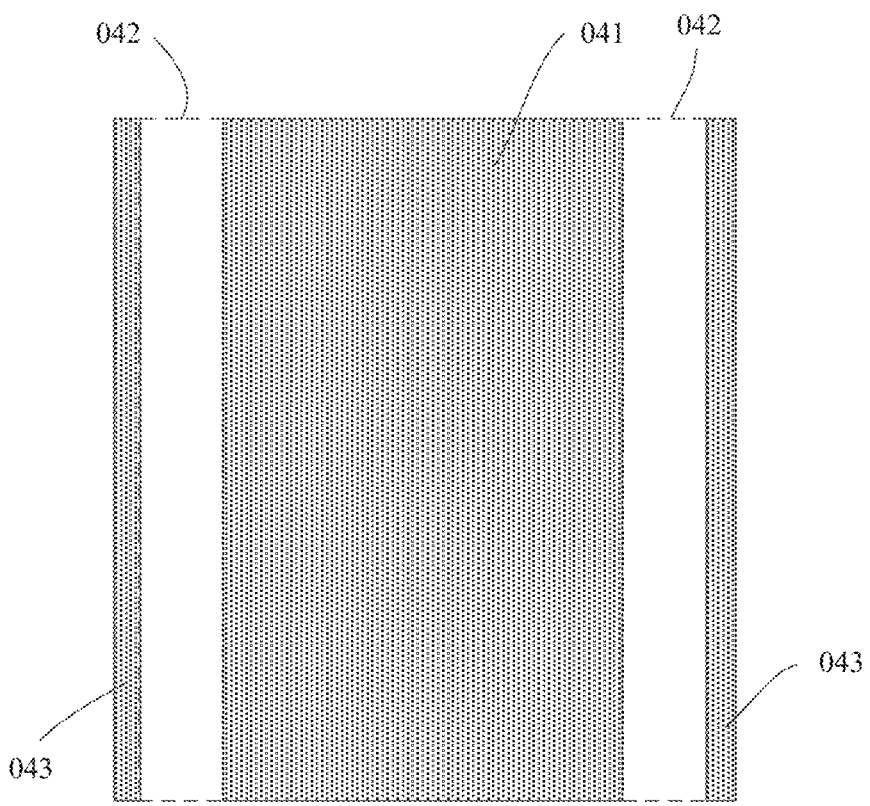
FIG. 6 is a schematic diagram of a structure of complete excavation of a support membrane layer corresponding to projection of bending regions.

FIG. 6 is a schematic diagram of a structure of complete excavation of a support membrane layer corresponding to projection of bending regions. At the cover layer 01, projection regions that are located in the support membrane layer 04 and that correspond to the bending regions 0122 are the projection regions 042. After the projection regions 042 are completely excavated, the support membrane layer 04 is no longer an integrated structure, and the support membrane layer 04 is divided into one main support region 041 and two side support regions 043. There are gaps between the main support region 041 and each of side support regions 043, and the gaps are two columns of excavated projection regions 042. That is, widths of the gaps are widths of the projection regions 042, which is equivalent to excavation of two arched edges in the curved surface positions of the support membrane layer 04.

The partial excavation manner means that crack occurrence frequency of the thin film packaging layer 02 in the curved surface positions, the projection regions 042 are pertinently and partially excavated based on crack occurrence probability. During partial excavation, the statistical result of crack occurrence frequency of the 17 subregions in the thin film packaging layer 02 in Table 1 can be combined. In Table 1, crack occurrence probability of the 17 equal subregions has the following features: Crack occurrence frequency of subregions 8-14 is relatively high, and correspondingly, subregions 8-14 have relatively high stress. Crack occurrence frequency in other subregions is relatively low, and correspondingly, stress in the other regions is also relatively low. In subregions 8-14, crack occurrence frequency of subregion 12 reaches a maximum value, crack occurrence frequency of subregion 9, subregion 11, and subregion 13 is only lower than the crack occurrence frequency of subregion 12. When the projection regions 042 in the support membrane layer 04 are partially excavated, various forms of excavation may be performed with reference to the features of crack occurrence frequency.

With reference to FIG. 3, the regions E are projection regions of the bending regions 0122 that are located on the two sides of the mobile phone with a dual-curved screen and that correspond to the thin film packaging layer 02; regions B are projection regions 042 that are located in the support membrane layer 04 and that correspond to the bending regions 0122, and thin film packaging layer 02, the display layer 03, and the support membrane layer 04 are covered through lamination. Therefore, it can be learned that widths of the regions E are equal to widths of the regions B. When a region E is equally divided into 17 subregions, a region B, namely the projection region 042, is equally divided into 17 subregions in a same way.

Figure 7:
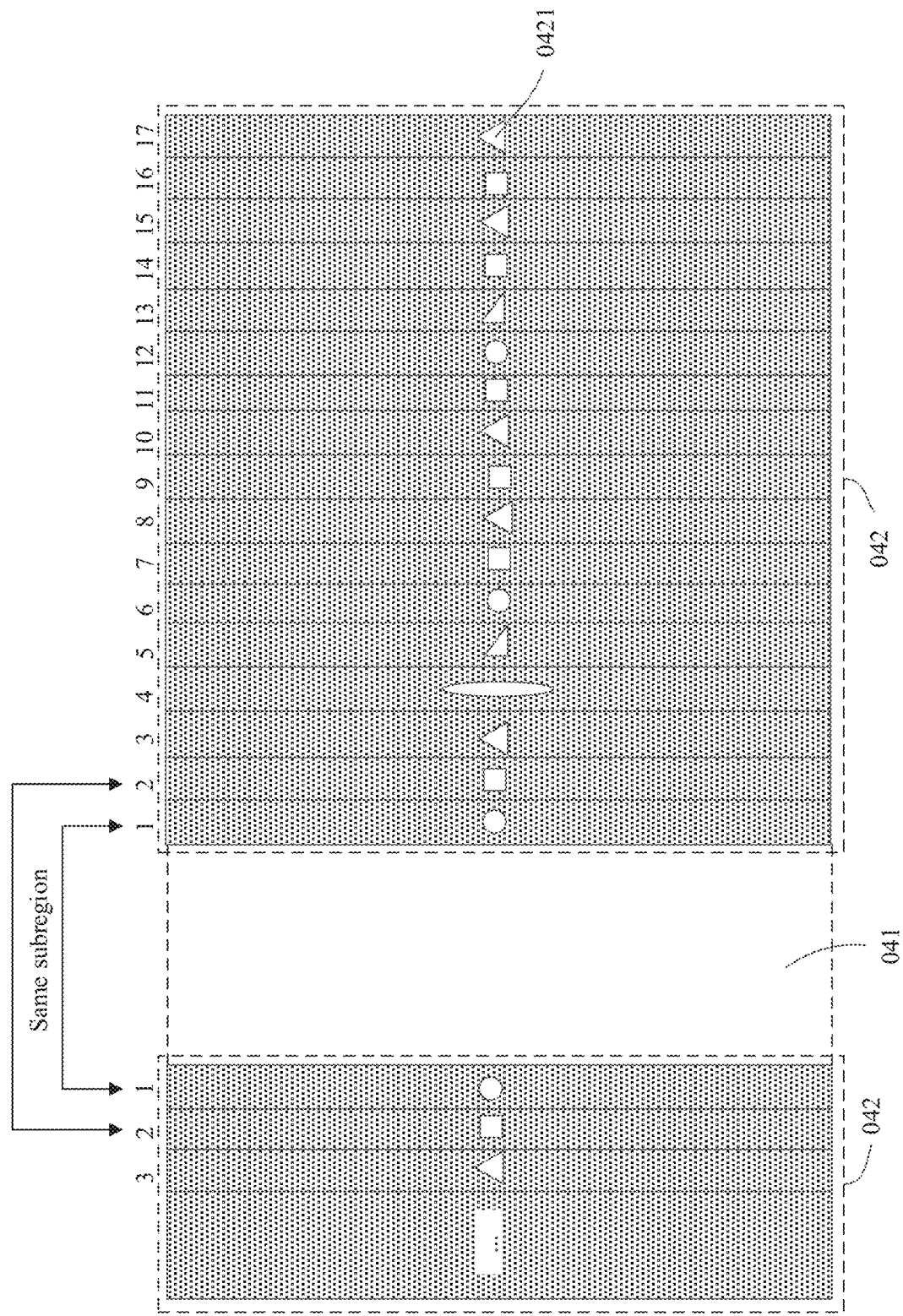
FIG. 7 is a schematic diagram of an enlarged structure of partial excavation of projection regions in a display module according to an embodiment of this application.

In the manner of partial excavating the projection regions 042, the gaps include M excavation regions 0421, where M is a positive integer and M≥1. FIG. 7 is a schematic diagram of an enlarged structure of partial excavation of projection regions in a display module according to an embodiment of this application. In FIG. 7, excavated geometric figures are the excavation regions 0421. With reference to this embodiment of this application, each projection region 042 is divided into 17 equal parts. Assuming that one geometric figure in each subregion is excavated. M is 34.

The 34 excavated geometric figures may be arbitrarily distributed. However, to enable stress sensed by same subregions on two sides of the display layer 03 to be same, this embodiment of this application uses the following implementation: The M excavation regions 0421 are symmetrically distributed in the two projection regions 042, and M is an even number. Correspondingly, as shown in FIG. 7, each projection region 042 includes M/2 excavation regions 0421. Specifically, a same subregion mean that when each projection region 042 is vertically divided into 17 equal parts, the main support region 041 is used as reference, and each projection region 042 is sequentially divided to two sides. As shown in the figure, a front view of FIG. 7 is used as an example, on a left side of the main support region 041, subregions of a projection region 042 are sequentially divided into subregion 17, subregion 16, . . . , subregion 2, and subregion 1 from left to right, and not all the subregions on the left side are drawn in the figure. Correspondingly, on a right side of the main support region 041, a projection region 042 is sequentially divided into subregion 1, subregion 2, . . . , and subregion 17 from left to right. As shown in the figure, in the two projection regions 042, subregion 1 on the left side and subregion 1 on the right side are a same subregion, subregion 2 on the left side and subregion 2 on the right side are a same subregion, and so on. In FIG. 7, proportions of the main support region 041 and the two projection regions 042 are only drawn as an example and do not represent actual shapes.

A reason for using this implementation is as follows: Assuming that the M excavation regions 0421 are arbitrarily distributed, the excavation regions 0421 corresponding to the projection regions 042 on two sides of same subregions may be different, and correspondingly, stress sensed by the display layer 03 in the same subregions may be different. Different stress may cause different crack occurrence probability of the thin film packaging layer 02, and therefore in a same subregion, a crack may occur on one side and no crack may occur on the other side. To avoid this situation, symmetrical distribution of the geometric figures on two sides is used as a manner for excavation. Shapes of the excavation regions 0421 include, but are not limited to, one or a combination of more than one of a circular shape, a square shape, a rhombic shape, an oval shape, a triangular shape, a star shape, and an irregular shape. In this way, the excavation schemes do not need to be limited during excavation, provided that excavated geometric figures in the same subregions are symmetrical and areas of the excavation regions 0421 are the same.

The following separately describes several partial excavation manners. Partial excavation can be divided into a first category and a second category based on different categories, where the first category is an even excavation manner and the second category is an uneven excavation manner. When the cover layer 01, the thin film packaging layer 02, the display layer 03, and the support membrane layer 04 are divided based on different subregions, division based on different subregions on two sides of the screen is the same, and excavated geometric figures and excavation areas are also the same. The following uses an excavation manner on one side as an example for detailed description, and the other side is not described herein again. Details are provided below.

In the first category, that is, the even excavation manner, even distribution of crack occurrence probability of the thin film packaging layer 02 in a curved surface position is taken into consideration. Assuming that a difference in crack occurrence probability of the 17 equal subregions is not large, an excavation range in each subregion is the same, in other words, areas of the M excavation regions 0421 are equal.

Figure 8:
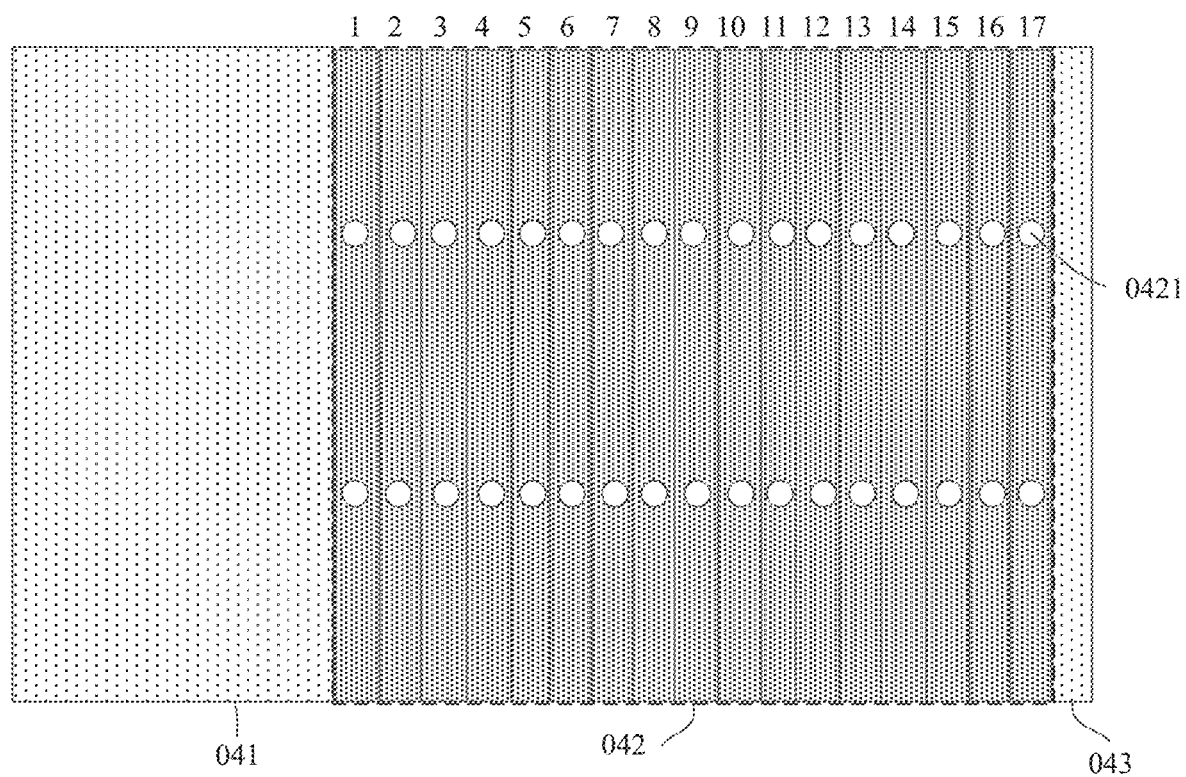
FIG. 8 is a schematic diagram of an enlarged structure of even excavation of a projection region on one side.

In an implementation, FIG. 8 is a schematic diagram of an enlarged structure of even excavation of a projection region on one side. In subregions 1-17 of the projection region 042, quantities and shapes of excavation regions 0421 in all the subregions are completely the same, and the shapes and quantities of columns of the excavation regions 0421 are not specifically limited. For example, in FIG. 8, a plurality of circular regions are evenly excavated, and a quantity of circular regions and sizes of the excavation shapes are the same, thereby ensuring a same total area of the excavation region 0421 in each subregion. The projection region 042 is evenly excavated, so that the curved surface positions of the support membrane layer 04 become relatively soft, and stress sensed by the display layer 03 in the curved surface positions become low, thereby avoiding the problem of a crack occurrence in the thin film packaging layer 02 in the curved surface positions.

In the second category, that is, the uneven excavation manner, with reference to the distribution features of crack occurrence probability of the subregions in the thin film packaging layer 02, a general idea is to set an excavation range based on crack occurrence probability of each subregion, and with reference to a case in which distribution of crack occurrence frequency of the thin film packaging layer 02 in Table 1 corresponds to stress values sensed by the subregions in the display layer 03, several possible uneven excavation manners are described below.

A possible uneven excavation manner is that on a basis of distribution of crack probability values of the subregions in the thin film packaging layer 02, 17 equal subregions are grouped into two groups based on crack probability values. One grouping threshold may be preset, a group whose crack probability value is greater than the grouping threshold is one group, and a group whose crack probability value is less than or equal to the grouping threshold is the other group. For example, if a crack occurrence probability value 6% is used as a grouping threshold, with reference to Table 1, crack occurrence probability of subregions 8-14 in the thin film packaging layer 02 is greater than 6%, so that in the projection region 042, the excavation regions 0421 corresponding to subregions 8-14 are grouped into a first group 04211. Correspondingly, if crack occurrence probability of subregions 1-7 and subregions 15-17 in the thin film packaging layer 02 is less than 6%, in the projection region 042, the excavation regions 0421 corresponding to subregions 1-7 and subregions 15-17 are grouped into second groups 04212. That is, in the uneven excavation manner, the M excavation regions 0421 include at least one first group 04211 and at least one second group 04212, and an area of the first group 04211 is greater than an area of the second group 04212.

In the first group 04211, crack probability values of subregions 8-14 are large, and therefore stress sensed by subregions 8-14 in the display layer 03 is relatively high. In the second groups 04212, crack probability values of subregions 1-7 and subregions 15-17 are small, and therefore stress sensed by subregions 1-7 and subregions 15-17 in the display layer 03 is relatively low. In this case, the used uneven excavation manner is that excavation ranges of regions with relatively high stress are relatively large, and excavation ranges of regions with relatively low stress are relatively small.

Figure 9:
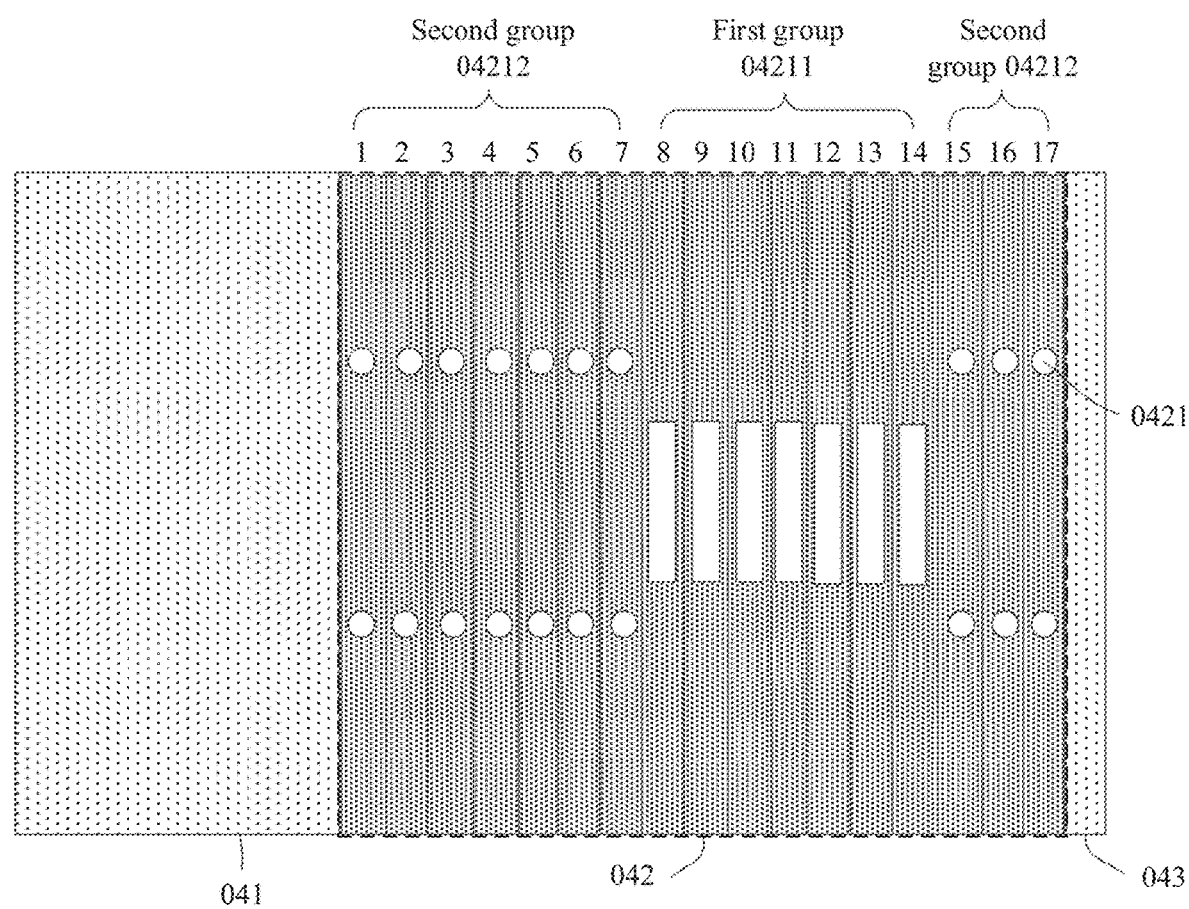
FIG. 9 is a schematic diagram of an enlarged structure of uneven excavation of a projection region on one side.

FIG. 9 is a schematic diagram of an enlarged structure of uneven excavation of a projection region on one side. In each of subregions 1-17, a length of the projection region 042 in the support membrane layer 04 is the same. If the entire support membrane layer 04 is of a same thickness, a larger excavation size of the projection region 042 indicates a larger excavation area. On a basis of the distribution features of crack occurrence probability of the subregions, in this embodiment of this application, the M excavation regions 0421 include two second groups 04212 that respectively include subregions 1-7 and subregions 15-17, and include one first group 04211 that includes subregions 8-14. The first group 04211 is disposed between the two second groups 04212. Because in the thin film packaging layer 02, crack occurrence probability of subregions 8-14 is relatively high and crack occurrence probability of subregions 1-7 and subregions 15-17 is relatively low, during uneven excavation, areas of the excavation regions 0421 in subregions 8-14 are relatively large, and areas of the excavation regions 0421 in subregions 1-7 and subregions 15-17 are relatively small. As shown in FIG. 9, the area of the first group 04211 is greater than the areas of the second groups 04212. In this excavation manner, the main support region 041 and the side support region 043 are not separated, and a gap is an excavated hole. When subregions 8-14 are completely excavated, the main support region 041 and the side support region 043 may be separated, and a gap is a crack, but in this case, a width of the crack is less than a width of the projection region 042.

If crack probability distribution and the 17 subregions in this embodiment of this application have different rules, for example, if crack probability is relatively scattered, there may be a plurality of first groups 04211 and a plurality of second groups 04212. When there are a plurality of groups, the first groups 04211 and the second groups 04212 are usually disposed at intervals.

It can be seen that the first uneven excavation manner follows the following principle: Crack occurrence probability is generally classified, for example, classified into a high crack probability region and a low crack probability region. In the relatively high crack probability region, an excavation range of the projection region 042 is relatively large; and conversely, in the relatively low crack probability region, an excavation range of the projection region 042 is relatively small. The first groups 04211 and the second groups 04212 that are on a same side are disposed at intervals, so that crack probability distribution can be intuitively reflected based on an area difference. In addition, this manner has an advantage that adaptive excavation is performed based on approximate crack occurrence probability, so that the entire support membrane layer 04 after excavation is adapted to stress distribution, and it is easily to implement in a process.

Another possible uneven excavation manner is that on a basis of the forgoing uneven excavation manner, crack occurrence probability of the thin film packaging layer 02 and stress sensed by the subregions are further limited. For example, with reference to Table 1 and FIG. 5, in subregions 8-14, crack occurrence probability of subregion 12 is the highest, in other words, stress sensed by subregion 12 is the highest; crack occurrence probability of subregion 13 is the second highest, and is only lower than crack occurrence probability of subregion 12; and crack occurrence probability of subregions 9-11 is lower than crack occurrence probability of subregion 12 and subregion 13, and crack occurrence probability is the third highest. Other subregions are arranged in descending order of crack occurrence probability. Among other subregions, the crack occurrence probability of subregions 5-8 is close to that of subregions 14-16, and the crack occurrence probability of subregions 1-4 is close to that of subregion 17. In this case, the excavation manner used for the projection region 042 may be that based on specific crack occurrence probability values of the subregions in the thin film packaging layer 02, the subregions in the projection region 042 are excavated based on proportions of crack occurrence probability.

To avoid a case in which a crack occurs on one side due to different stress sensed by two sides of the display layer 03, this embodiment of this application still considers that areas of the excavation regions 0421 in same subregions on two sides are the same.

Assuming that the two projection regions 042 have M excavation regions 0421 in total, each side has M/2 excavation regions 0421. In the projection region 042 on any side, areas of the M/2 excavation regions 0421 are partially equal or all unequal. Any excavation region 0421 has a corresponding crack probability value, and areas of excavation regions 0421 with large crack probability values are greater than areas of excavation regions 0421 with small crack probability values, in other words, crack probability values are positively correlated with areas of excavation regions 0421.

Figure 10:
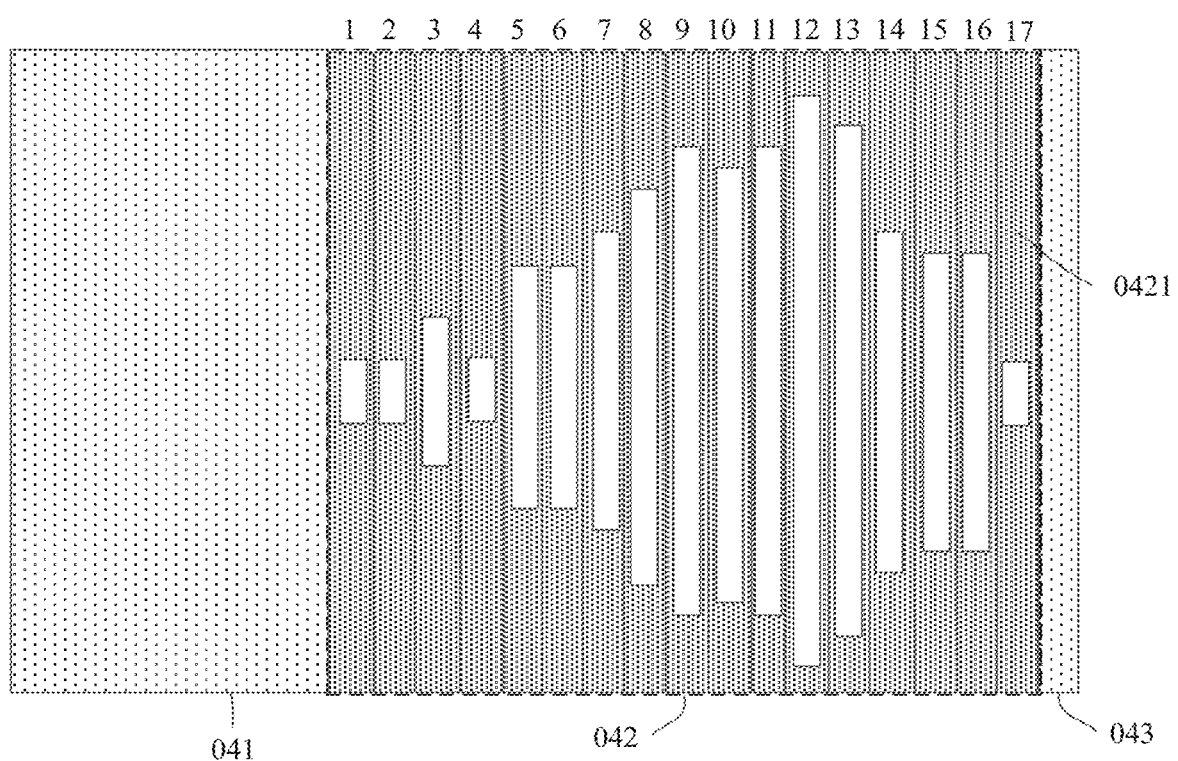
FIG. 10 is a schematic diagram of an enlarged structure of another uneven excavation of a projection region on one side.

FIG. 10 is a schematic diagram of an enlarged structure of another uneven excavation of a projection region on one side. The figure shows an excavation effect in which the crack probability values are positively correlated with the areas of the excavation regions 0421. In subregions 1-17, crack occurrence probability of subregion 12 is the highest, so that 90% of an entire region range of subregion 12 may be excavated; crack occurrence probability of subregion 13 is the second highest, so that 80% of an entire region range of subregion 13 may be excavated: and crack occurrence probability of subregions 9-11 is the third highest, so that 70% of an entire region range of subregions 9-11 may be excavated. Among other subregions, crack occurrence probability of subregions 5-8 is close to that of subregions 14-16, and average crack occurrence probability of subregions 5-8 and subregions 14-16 is about half of the crack occurrence probability of subregion 12, so that 45% of an entire region range of subregions 5-8 and subregions 14-16 may be excavated; and crack occurrence probability of subregions 1-4 is close to that of subregion 17, and crack occurrence probability of subregions 1-4 and subregion 17 is relatively small, so that 10% of an entire region range of subregions 1-4 and subregion 17 may be excavated. In this excavation manner, the main support region 041 and the side support region 043 are also not separated, and a gap is still an excavated hole.

It can be learned that this uneven excavation manner follows the following principle: Targeted classification is performed based on crack occurrence probability, for example, excavation regions are arranged in descending order of crack occurrence probability. Higher crack occurrence probability indicates a larger excavation range, and conversely, lower crack occurrence probability indicates a smaller excavation range. This manner has an advantage that targeted excavation is performed based on actual crack occurrence probability values, so that an excavation area of the projection region 042 is proportional to crack occurrence probability of the subregions in the thin film packaging layer 02, that is, in the thin film packaging layer 02, subregions with high crack occurrence probability indicates large areas of the excavation regions 0421; and in this case, remaining areas of the projection region 042 become small. In this way, stress sensed by the display layer 03 here is previously extremely large, but after excavation, stress sensed by the display layer 03 becomes significantly small, and correspondingly, the subregions are excavated in this manner, so that the excavation regions 0421 of the projection regions 042 on two sides completely correspond to crack probability distribution, thereby avoiding crack occurrence to a maximum extent.

With reference to Table 1 and FIG. 5, it can be found, according to the statistical analysis result of crack occurrence probability of the 17 subregions in the thin film packaging layer 02, that crack occurrence probability generally has a specific rule, that is, crack occurrence probability reaches a peak at a specific position, and probability on two sides generally becomes gradually small. In this embodiment of this application, still another uneven excavation manner may be that one or two regions in the center are used as reference subregions, excavation areas of the regions in the center are the largest, excavation areas of remaining regions are centered on the reference subregions, and successively decrease to two sides. The areas of the one or two excavation regions 0421 in the center are greater than areas of the excavation regions 0421 on two sides, and the areas of the excavation regions 0421 on two sides show a gradient decrease from the center to the two sides.

Figure 11:
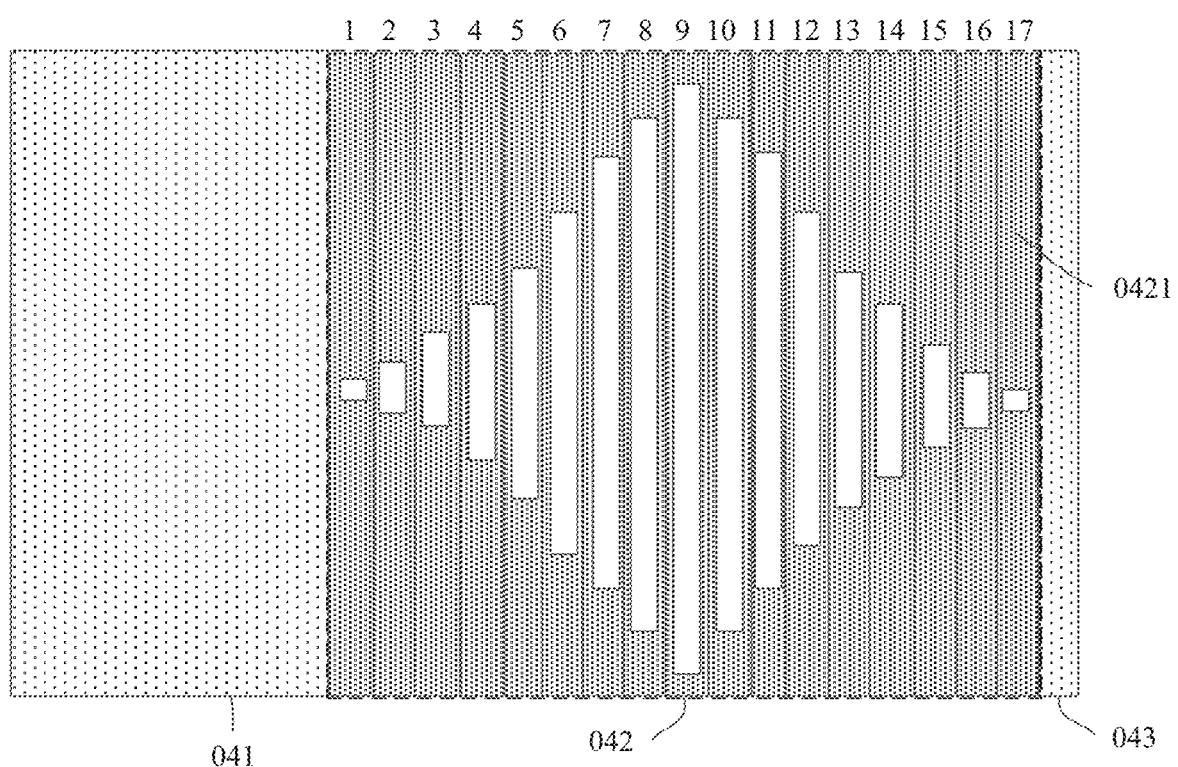
FIG. 11 is a schematic diagram of an enlarged structure of still another uneven excavation of a projection region on one side.

FIG. 11 is a schematic diagram of an enlarged structure of still another uneven excavation of a projection region on one side. In this uneven excavation manner, for subregions 1-17 of projection region 042 on any side, subregion 9 is a reference subregion in the center, and an area of an excavation region 0421 in subregion 9 may be set to 90% of an entire region area in subregion 9, in other words, 90% of the area of subregion 9 is excavated. In this case, according to the rule that the areas of the excavation regions 0421 on the two sides successively decrease, a decreasing threshold may be preset. Assuming that a decreasing threshold is set to 10%, subregion 9 is used as a center, areas of the excavation regions 0421 in other subregions on two sides of subregion 9 successively decrease by 10%. According to this rule, in subregion 8 and subregion 10, 80% of an entire subregion range is excavated; in subregion 7 and subregion 11, 70% of an entire subregion range is excavated; in subregion 6 and subregion 12, 60% of an entire subregion range is excavated; and so on; and in subregion 1 and subregion 17, 10% of an entire subregion range is excavated.

This excavation manner is based on the feature that crack probability distribution reaches a peak at a specific position, which is similar to the rule in this embodiment of this application that a reference subregion is used as a center and areas of the excavation regions on the two sides successively decrease. This manner has an advantage that with reference to the distribution features of crack occurrence probability, and assuming that a central position of the subregions is a stress accumulation position, reference subregion 9 in the center is used as a demarcation point, and the subregions are excavated to the two sides in a successively decreased manner, so that areas of the excavation regions 0421 in subregions 1-17 generally correspond to stress distribution, and it is also easy to implement in a process.

During complete excavation or partial excavation of the projection regions 042 of the support membrane layer 04, two manners may be used for implementation. In one manner, when a manufacturer processes a raw material of the support membrane layer 04, a region stress accumulation position may be simulated, and a groove of a specific figure is directly formed in a die cutting or laser cutting manner. In the other manner, after the support membrane layer 04 is laminated with the display layer 03, a module factory uses a laser cutting manner to form a groove of a specific figure.

Regardless of complete excavation or partial excavation of the projection regions 042, a same purpose is to enable the support membrane layer 04 in the curved surface positions to become relatively soft in an excavation manner. The support membrane layer 04 supports the display layer 03, after the support membrane layer 04 becomes soft in the excavation manner, stress sensed by the entire display layer 03 in the curved surface positions becomes low, thereby avoiding the problem of a crack occurrence in the thin film packaging layer 02 in the curved surface positions.

Figure 12:
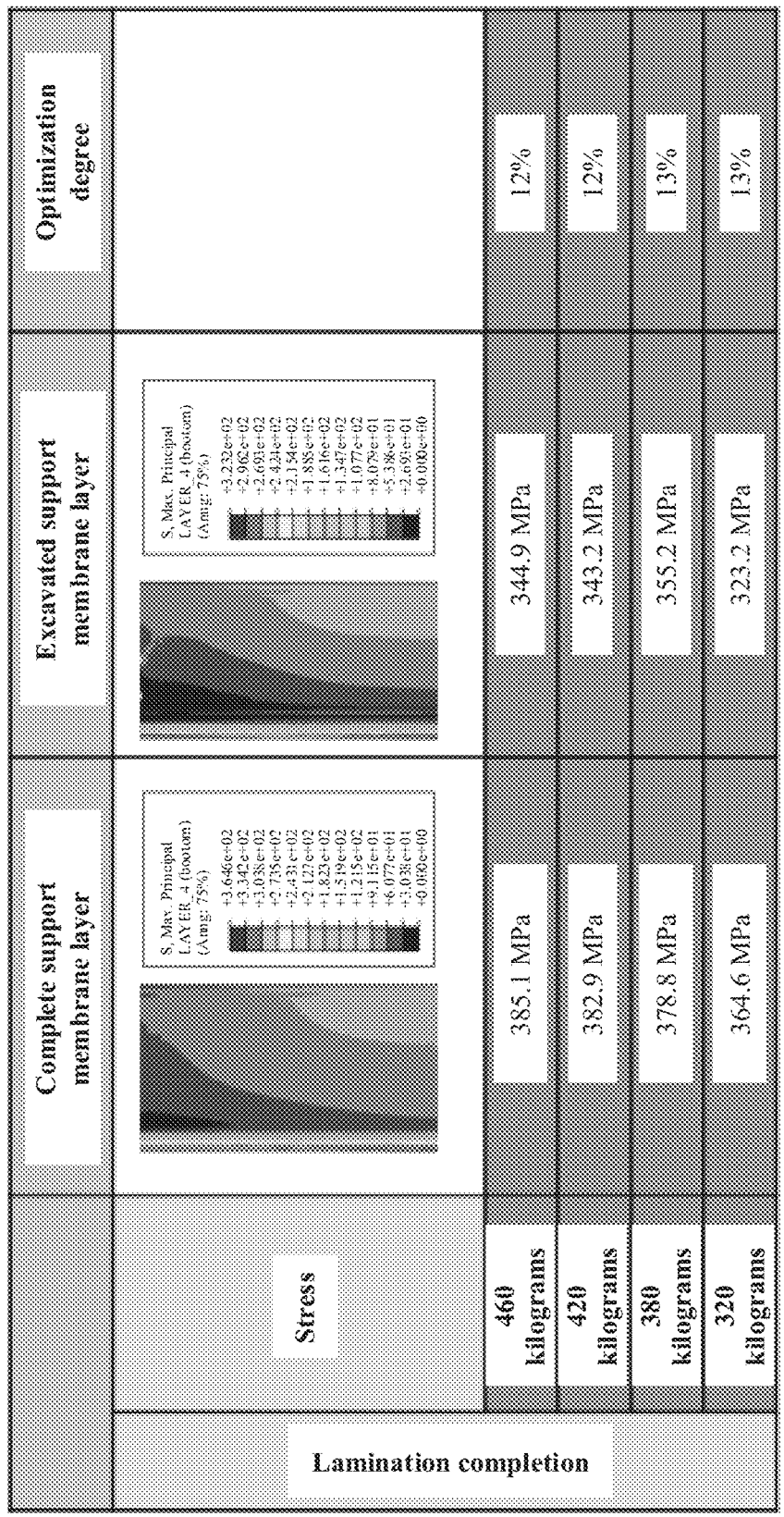
FIG. 12 is a diagram of a stress simulation result of complete excavation and partial excavation of a laminated display module through simulation.

FIG. 12 is a diagram of a stress simulation result of complete excavation and partial excavation of a laminated display module through simulation. After all layers of the laminated display module are laminated, it can be seen from FIG. 12 that if the support membrane layer 04 is complete, that is, different external forces are exerted on the support membrane layer 04 without excavation of the projection regions 042, in the curved surface positions, a stress range sensed by the display layer 03 is 364.6 Mpa to 385.1 MPa, and after the projection regions 042 are completely excavated or partially excavated, a stress range sensed by the display layer 03 through simulation is 323.2 Mpa to 344.9 Mpa. Therefore, it can be learned that stress sensed by the display layer 03 is significantly reduced, thereby avoiding a case in which a stress value exceeds a stress threshold that the display layer 03 can bear, and further avoiding the problem of a crack occurrence in the thin film packaging layer 02.

Figure 13:
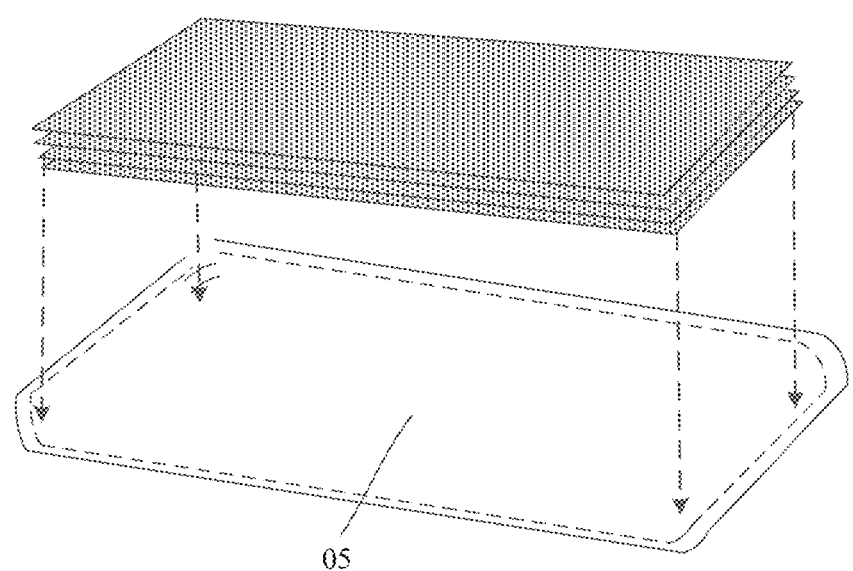
FIG. 13 is a schematic diagram of a structure of an electronic device according to an embodiment of this application.

This application further provides an electronic device. FIG. 13 is a schematic diagram of a structure of an electronic device according to an embodiment of this application. The electronic device includes a housing 05 and a laminated display module, and the laminated display module is buckled in the housing 05. The laminated display module herein is the laminated display module in the foregoing embodiment. A crack occurrence in a thin film packaging layer in curved surface positions can be avoided based on a structural design of the laminated display module, thereby achieving a better display effect of the electronic device.

This application is applicable to a terminal electronic device with curved surface shapes, for example, the terminal electronic device includes but is not limited to a mobile phone with a dual-curved screen, a tablet, or the like. For application of the technical solutions provided in the embodiments of this application in another design, details are not described herein again. Based on the teaching on the technical concepts in the embodiments of this application, a person skilled in the art can further consider applying the technical solutions in the embodiments of this application to the another design, and these designs does not go beyond the protection scope of the embodiments of this application.

A person skilled in the art may easily think of another implementation solution of this application after considering the specification and practicing the application disclosed herein. This application is intended to cover any variations, uses, or adaptations of this application. These variations, uses, or adaptations follow the general principles of this application and include common knowledge or conventional technical means in the art that are not disclosed in this application. The specification and the embodiments are considered as examples, and the true scope and spirit of this application are indicated by the following claims.

It should be understood that this application is not limited to the precise structures described above and shown in the accompanying drawings, and various modifications and changes may be made without departing from the scope thereof. The scope of this application is limited only by the appended claims.

What is claimed is:

1. A laminated display module, comprising:
   a cover layer, a thin film packaging layer, a display layer, and a support membrane layer that are sequentially covered through lamination from top to bottom, wherein
   the cover layer comprises a smooth region and two curved surface regions along a longitudinal direction, the two curved surface regions are respectively located on two sides of the smooth region, wherein each curved surface region comprises one bending region, and each bending region is projected onto the support membrane layer to form a projection region; and
   the support membrane layer comprises a main support region and two side support regions along a longitudinal direction, and a gap is provided between either of the side support regions and the main support region,
   wherein the gap comprises M excavation regions, wherein M is a positive integer and M≥1, wherein the M excavation regions comprise a first group of excavation regions and a second group of excavation regions, the first group and the second group have the same number of excavation regions, and a total area of the first group is greater than a total area of the second group.

2. The laminated display module according to claim 1, wherein a width of the gap is equal to a width of a projection region on a same side.

3. The laminated display module according to claim 1, wherein the M excavation regions are evenly distributed in two projection regions, M is an even number, and each projection region comprises M/2 excavation regions.

4. The laminated display module according to claim 1, wherein shapes of the excavation regions comprise at least one of a circular shape, a square shape, a rhombic shape, an oval shape, a triangular shape, a star shape, and an irregular shape.

5. The laminated display module according to claim 1, wherein the M excavation regions comprise a third groups; and
   the first group is disposed between the second group and the third group.

6. An electronic device, comprising a housing and a laminated display module, wherein the laminated display module is buckled in the housing, and the laminated display module comprises:
   a cover layer, a thin film packaging layer, a display layer, and a support membrane layer that are sequentially covered through lamination from top to bottom, wherein
   the cover layer comprises a smooth region and two curved surface regions along a longitudinal direction, the two curved surface regions are respectively located on two sides of the smooth region, a first curved surface region of the two curved surface regions extends from a first edge of the smooth region to a first edge of the cover layer, and a second curved surface region of the two curved surface regions extends from a second edge of the smooth region to a second edge of the cover layer, wherein each curved surface region comprises one bending region, and each bending region is projected onto the support membrane layer to form a projection region; and
   the support membrane layer comprises a main support region and two side support regions along a longitudinal direction, and a gap is provided between either of the side support regions and the main support region;
   the gap comprises M excavation regions, wherein M is a positive integer and M≥1;
   the M excavation regions are evenly distributed in two projection regions, M is an even number, and each projection region comprises M/2 excavation regions;
   in the projection region on any side, areas of the M/2 excavation regions are equal, partially equal or all unequal;
   each excavation region corresponds to a crack probability value, wherein the crack probability value is positively correlated with an area of the excavation region, and an area of the excavation region with a large crack probability value is greater than an area of the excavation region with a small crack probability value; and
   a distance projected by the curved surface region onto a plane of the support membrane layer along the longitudinal direction is denoted as A, a distance projected by the bending region onto the plane is denoted as B, a distance projected by an extension region onto the plane is denoted as C, wherein the extension region extends from an edge of the bending region to an edge of the cover layer and extension region is a lamination junction, and A, B, and C meet a relationship of B≥41% A and C≤41% A.

7. A laminated display module, comprising:

a cover layer, a thin film packaging layer, a display layer, and a support membrane layer that are sequentially covered through lamination from top to bottom, wherein the cover layer comprises a smooth region and two curved surface regions along a longitudinal direction, the two curved surface regions are respectively located on two sides of the smooth region, a first curved surface region of the two curved surface regions extends from a first edge of the smooth region to a first edge of the cover layer, and a second curved surface region of the two curved surface regions extends from a second edge of the smooth region to a second edge of the cover layer, wherein each curved surface region comprises one bending region, and each bending region is projected onto the support membrane layer to form a projection region; and the support membrane layer comprises a main support region and two side support regions along a longitudinal direction, and a gap is provided between either of the side support regions and the main support region;

the gap comprises M excavation regions, wherein M is a positive integer and M≥1;

the M excavation regions are evenly distributed in two projection regions, M is an even number, and each projection region comprises M/2 excavation regions;

in the projection region on any side, areas of the M/2 excavation regions are equal, partially equal or all unequal;

each excavation region corresponds to a crack probability value, wherein the crack probability value is positively correlated with an area of the excavation region, and an area of the excavation region with a large crack probability value is greater than an area of the excavation region with a small crack probability value; and a distance projected by the curved surface region onto a plane of the support membrane layer along the longitudinal direction is denoted as A, a distance projected by the bending region onto the plane is denoted as B, a distance projected by an extension region onto the plane is denoted as C, wherein the extension region extends from an edge of the bending region to an edge of the cover layer and extension region is a lamination junction, and A, B, and C meet a relationship of B≥41% A and C≤41% A.

8. The laminated display module according to claim 7, wherein a width of the gap is equal to a width of a projection region on a same side.

9. The laminated display module according to claim 7, wherein shapes of the excavation regions comprise at least one of a circular shape, a square shape, a rhombic shape, an oval shape, a triangular shape, a star shape, and an irregular shape.

10. The laminated display module according to claim 7, wherein the M excavation regions comprise a first group and a second group, and an area of the first group is greater than an area of the second group.

11. The laminated display module according to claim 10, wherein the M excavation regions comprise at least two second groups; and the first group is disposed between the at least two second groups.

12. The laminated display module according to claim 7, wherein in a projection region on any side, areas of one or two excavation regions in the center are greater than areas of the excavation regions on two sides, and the areas of the excavation regions on the two sides successively decrease from the center to the two sides.

13. The electronic device according to claim 6, wherein a width of the gap is equal to a width of a projection region on a same side.

14. The electronic device according to claim 6, wherein shapes of the excavation regions comprise at least one of a circular shape, a square shape, a rhombic shape, an oval shape, a triangular shape, a star shape, and an irregular shape.

15. The electronic device according to claim 6, wherein the M excavation regions comprise a first group and a second group, and an area of the first group is greater than an area of the second group.

16. The electronic device according to claim 15, wherein the M excavation regions comprise at least two second groups; and the first group is disposed between the at least two second groups.

17. The electronic device according to claim 6, wherein in a projection region on any side, areas of one or two excavation regions in the center are greater than areas of the excavation regions on two sides, and the areas of the excavation regions on the two sides successively decrease from the center to the two sides.

* * * * *

UNITED STATES PATENT AND TRADEMARK OFFICE
CERTIFICATE OF CORRECTION

PATENT NO. : 12,401,737 B2  
APPLICATION NO. : 18/004143  
DATED : August 26, 2025  
INVENTOR(S) : Yujun Zhang and Ning Guo Page 1 of 1

It is certified that error appears in the above-identified patent and that said Letters Patent is hereby corrected as shown below:

In the Claims

In Column 17, In Line 5, In Claim 6, delete "layer" and insert -- layer, --.

In Column 17, In Line 21, In Claim 7, delete "laver," and insert -- layer, --.

In Column 18, In Line 1, In Claim 7, delete "layer" and insert -- layer, --.

Signed and Sealed this  
Ninth Day of December, 2025

John A. Squires  
*Director of the United States Patent and Trademark Office*